United States Patent [19]

Teague et al.

[11] Patent Number: 4,825,177
[45] Date of Patent: Apr. 25, 1989

[54] MICROWAVE AMPLIFIER AND OTHER MICROWAVE COMPONENTS

[75] Inventors: Randy Teague, Syosset; Michael E. Weinstein, Huntington Station, both of N.Y.

[73] Assignee: General Instrument Corporation, New York, N.Y.

[21] Appl. No.: 109,101

[22] Filed: Oct. 16, 1987

[51] Int. Cl.⁴ .............................................. H03F 3/68
[52] U.S. Cl. ...................................... 330/295; 330/53
[58] Field of Search ...................... 330/53, 54, 55, 56, 330/295; 333/116

[56] References Cited

U.S. PATENT DOCUMENTS 4,631,493  12/1986  Vendelin et al. ..................... 330/54

Primary Examiner—Gene Wan
Attorney, Agent, or Firm—Kramer, Brufsky & Cifelli

[57] ABSTRACT

A broad band, balanced microwave component, such as an amplifier, includes an input Lange coupler having a first center frequency and an output Lange coupler having a second center frequency. The center frequencies of the two Lange couplers are offset or the coupling is different so that at least one of the cross-over points of the input Lange coupler is offset in frequency from both the cross-over points of the output Lange coupler. The pair of Lange couplers so offset in frequency yields no more than one peak in gain which is readily equalized by single-ended amplifiers within the balanced amplifier.

24 Claims, 5 Drawing Sheets

MICROWAVE AMPLIFIER AND OTHER MICROWAVE COMPONENTS

BACKGROUND OF THE INVENTION

The present invention relates generally to balanced microwave components and deals more particularly with microwave amplifiers having near constant gain over a broad band, processes for making such amplifiers, and other microwave components having desirable transfer functions.

It is presently known to use a single-ended microwave amplifier comprising in series an input matching network, an active gain device, and an output matching network. Typically, the gain of the active device varies with frequency and is greater at lower frequencies than at higher frequencies within the operating band. To compensate for the gain variation of the active device, the input and output matching networks are purposely designed to substantially mismatch the impedances of associated transmission lines at the low frequencies and provide better matching at the higher frequencies. Even though such a matching technique tends to equalize the overall gain of the amplifier, the input and output matching devices cause undesirable reflections at the frequencies of mismatch and a resultant gain ripple in the operating band. The problem is exacerbated if two or more of the single-ended amplifiers are cascaded, because the reflections add to one another in and out of phase between the stages.

It is also presently known to use a balanced configuration of amplifiers, as shown in FIG. 1 and described in more detail below, to mask the reflections. The balanced amplifier includes two identical single-ended amplifiers, as described above, and two identical 3 dB 90° hybrid couplers such as Lange couplers, one preceding and one following the pair of single-ended amplifiers. The Lange couplers attempt to mask reflections created at the inputs to the input matching devices and at the outputs of the output matching devices of the single-ended amplifiers. However, the Lange couplers are not extremely effective in masking the reflections at frequencies at the band edges and at the center of the band, so that the balanced amplifier gain will not be uniform throughout the band.

The presently known balanced amplifiers are manually tuned after manufacture to attempt to flatten the gain. However, the tuning requires skilled labor, is time-consuming and is not 100% effective.

It is also presently known to provide balanced pin-diode attenuators and balanced gain equalizers which are similar in design to the balanced microwave amplifiers described above, except that pin diodes and passive equalizing circuits, respectively, replace the single-ended amplifiers. Such balanced attenuators and equalizers also utilize identical Lange or other 3 dB 90° hybrid couplers at the input and output which cause two peaks in the transfer function of the balanced attenuator and equalizer. Generally, the two peaks are not desirable.

A general object of the present invention is to provide a microwave amplifier having a substantially flat gain over a broad band.

Another object of the present invention is to provide amplifiers of the foregoing type which are cascadable without excessive gain ripple.

Still another object of the present invention is to provide an amplifier of the foregoing type which exhibits an acceptable uniformity in gain with little or no tuning, or a much better uniformity in gain than conventional balanced amplifiers with the same amount of tuning for each.

Yet another object of the present invention is to provide methods for designing amplifiers of the foregoing types.

A further object of the present invention is to improve the transfer function of other balanced microwave components, such as balanced pin-diode attenuators and balanced gain equalizers.

SUMMARY OF THE INVENTION

The invention resides in a broad band, balanced microwave amplifier comprising an input Lange coupler or other coupler receiving an input signal, a first single-ended amplifier receiving a portion of the input signal travelling through the input Lange coupler, a second single-ended amplifier receiving a portion of the input signal coupled through the input Lange coupler, and an output Lange coupler or other coupler receiving the input signal portions after amplification by the single-ended amplifiers. At least one of the cross-over points of the input Lange coupler is substantially offset in frequency from both the cross-over points of the output Lange coupler. The pair of Lange couplers creates no more than one peak in gain and this peak is readily equalized by the single-ended amplifiers.

According to one feature of the invention, the center frequency of the input Lange coupler is substantially different than the center frequency of the output Lange coupler.

The invention also resides in a method for producing the foregoing balanced amplifier.

The invention also resides in other balanced microwave components, such as a balanced pin-diode attenuator and a balanced gain equalizer in which one of the cross-over points of the input Lange coupler or other coupler is substantially offset in frequency from both the cross-over points of the output Lange coupler or other coupler.

p DETAILED DESCRIPTION OF THE PREFERRED EMBODIMENTS

Figure 1:
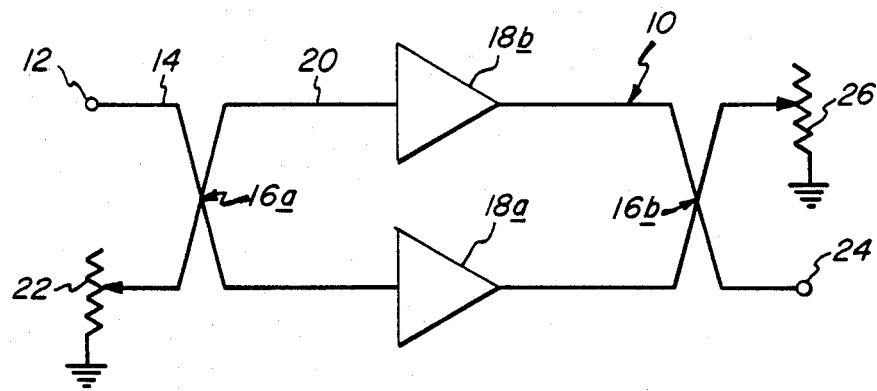
FIG. 1 is a schematic diagram of a balanced amplifier according to the prior art.

Before describing the present invention, it will be helpful to review the design of a conventional microwave balanced amplifier and the problems inherent in it. FIG. 1 illustrates a microwave balanced amplifier generally designated 10 in accordance with the prior art. An input microwave signal is applied to an input port 12, which signal travels along a conductor 14 to an input Lange coupler 16 or other 3 dB 90° hybrid coupler. A portion of the input signal proceeds through the Lange coupler to a first single-ended amplifier 18a, and another portion of the input signal is coupled to another conductor 20 which routes this portion of the signal to another single-ended amplifier 18b. The other end of the conductor 20 terminates at a load 22. The outputs of the single-ended amplifiers 18a and 18b are transmitted to an output Lange coupler 16b. A first portion of the output of the Lange coupler 16b is transmitted to an output port 24 and a second portion of the output of the Lange coupler 16b is transmitted to a termination load 26 (e.g., 50 ohm) where it is dissipated.

Figure 2:
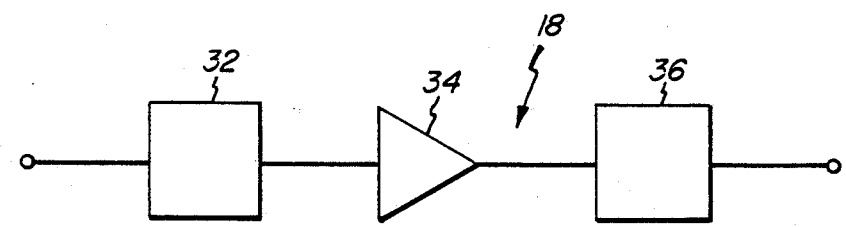
FIG. 2 is a schematic diagram of each of two, identical single-ended amplifiers contained within the balanced amplifier of FIG. 1.

FIG. 2 illustrates the components within each of the single-ended amplifiers 18a and 18b. Each of the amplifiers 18 includes an input matching network 32, an active gain device 34, and n output matching network 36. As noted above, the impedance match exhibited by each of the networks 32 and 36 attempts to equalize the gain of the overall single-ended amplifier.

Figure 3A:
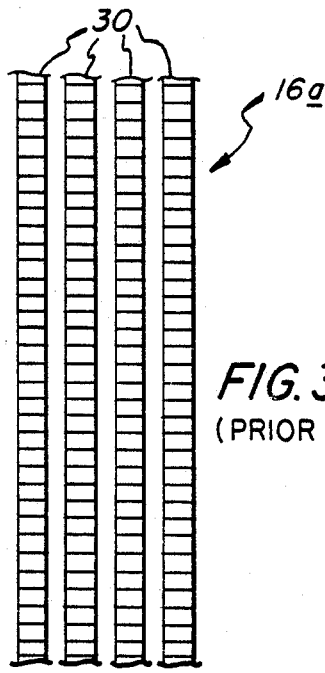
FIG. 3(a) is a schematic diagram of a Lange coupler utilized within an input portion of the balanced amplifier of FIG. 1.
Figure 3B:
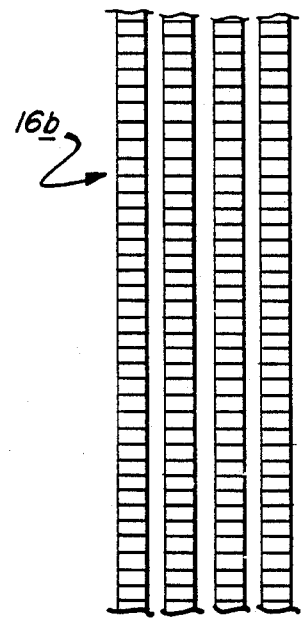
FIG. 3(b) is a schematic diagram of another, identical Lange coupler utilized within an output portion of the balanced amplifier of FIG. 1.

FIG. 3(a) schematically illustrates the Lange coupler 16a in the input portion of the balanced amplifier and FIG. 3(b) schematically illustrate the Lange coupler 16b in the output portion of the balanced amplifier 10. The Lange couplers 16a and 16b comprise a plurality of finger-like elements 30, whose length determines a center frequency of the Lange coupler. The width of the finger-like elements 30, and/or the gaps between them determine the even and odd mode characteristic impedance which determines the magnitude of coupling of the signal from the input conductor 14 to the conductor 20, and between the two conductors at the outputs of the output Lange coupler 16b. Both of the Lange couplers 16a and 16b are the same and exhibit the same properties, such as center frequency and coupling as a function of frequency.

Figure 4:
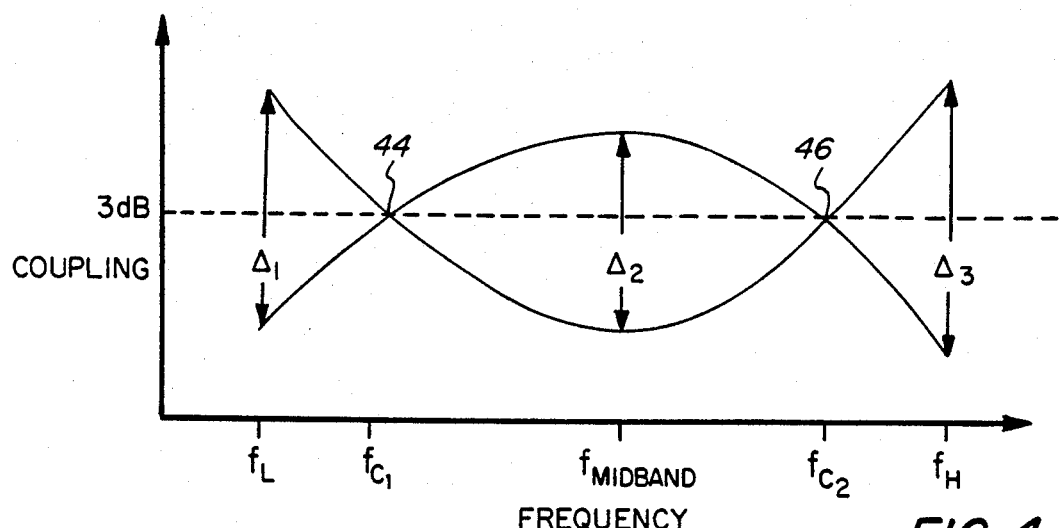
FIG. 4 is a graph illustrating the coupling of each of the Lange couplers of FIG. 3 as a function of frequency.

FIG. 4 graphically illustrates the magnitude of the coupling of the Lange couplers 16a and 16b as a function of frequency with a graph 40 representing the magnitude of the thru-put signal and a graph 42 representing the magnitude of the coupled signal. The two graphs 40 and 42 cross over at points 44 and 46 corresponding respectively to frequencies $fc_1$ and $fc_2$. At the cross-over points 44 and 46, the thru-put energy equals the coupled energy or in other words, the coupling is minus 3 dB.

However, at the midpoint of the band, $f_m$, and at the edges of the band, $f_l$ and $f_h$, the difference in coupling (delta) is maximum and approximately the same, delta 1=delta 2=delta 3. These delta values are determined by the even and odd mode characteristic impedances. It should be noted that the even and odd mode characteristic impedances determine in part the cross-over frequencies because their impedances effect the vertical displacement of the curves 40 and 42.

Assuming a signal of amplitude and phase, $A < 0°$, is applied to the input port 12, then at the frequencies $fc_1$ and $fc_2$, the amplitudes and phases of the signals at the outputs of the Lange coupler 16a are $(A/\sqrt{2}) < 0°$ and $(A/\sqrt{2}) < -90°$. The split signals are reflected back from the input matching devices 32 due to mismatch. However, because the input matching devices 32 of the single-ended amplifiers are identical, reflected signals have amplitudes and phases $(XA/\sqrt{2}) < 0° - \theta$ and $(XA/\sqrt{2}) < -90° - \theta$, where X is a scaler representing the magnitude of the reflectivity and $\theta$ is the phase offset of the reflected wave. After passing through the Lange coupler 16a in the reverse direction, the recombined signal at the input port 12 cancels because the reflection entering the Lange coupler 16a from the conductor 20 is delayed in phase another 90° so that it is 180° out of phase with the thru-put reflected signal. Consequently, all the energy of the reflectons is absorbed and dissipated in the load 22 which causes no harm.

Figure 5:
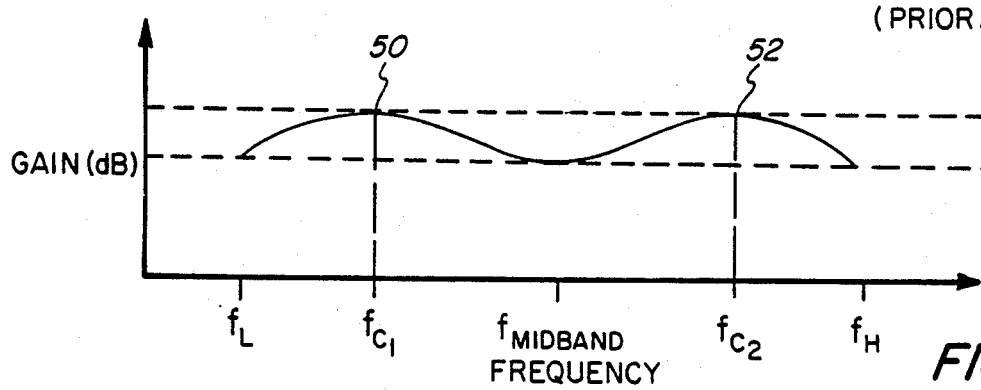
FIG. 5 is a graph illustrating the effect of the input and output Lange couplers on the gain of the balanced amplifier of FIG. 1.

At the other frequencies, the coupling provided by each of the Lange couplers 16a and 16b is not minus 3 dB so that the reflections do not precisely cancel and the overall gain of the balanced amplifier is adversely affected and in fact decreased. In addition, without precise 3 dB power splitting, the input signal splits imperfectly at the input coupler 16a and subsequently recombines imperfectly at the output coupler 16b. FIG. 5 illustrates the effect of the input and output Lange couplers on the gain of the balanced amplifier 10, or in other words, the overall gain of the balanced amplifier 10 which would occur if each of the single-ended amplifiers 18 exhibited uniform gain over the entire operating band. Notice that the gain is rippled and exhibits peaks 50 and 52 at the cross-over frequencies $fc_1$ and $fc_2$.

In the prior art, it is known to attempt to design input and output matching networks which equalize the rippling effect due to the variation in coupling of the Lange couplers 16a and 16b. However, to equalize such rippling, the matching networks 32 and 36 would have to exhibit a relatively good impedance match at the low edge of the band, $f_L$, a relative poor impedance match at the lower cross-over frequency $fc_1$, a relatively good impedance match at the mid-frequency of the operating band, $f_m$, a relatively poor impedance match at the upper cross-over frequency $fc_2$, and a relatively good impedance match at the upper edge of operating band, $f_h$. Such matching networks require several gain ripples and are difficult to design.

Figure 6:
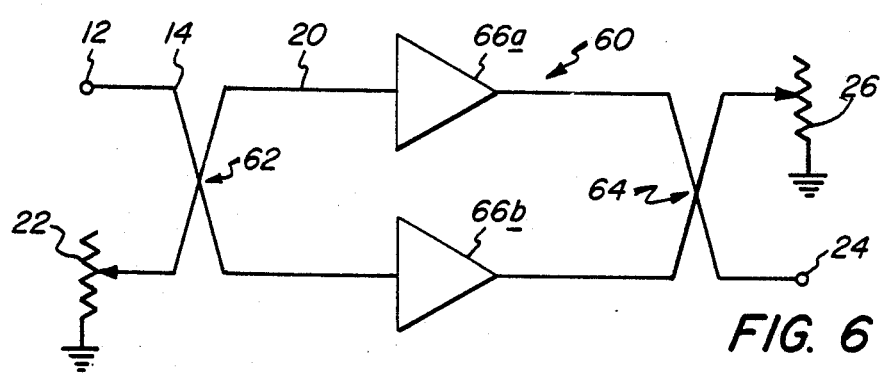
FIG. 6 is a schematic diagram illustrating a balanced amplifier in accordance with the present invention.
Figure 7:
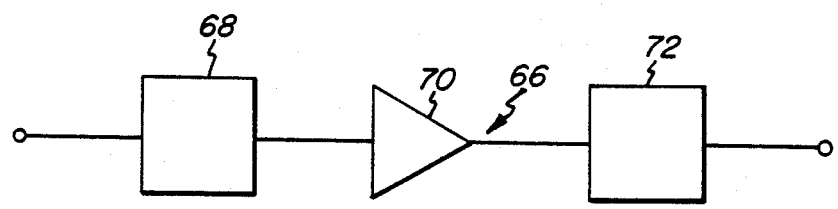
FIG. 7 is a schematic diagram of each of two, substantially identical single-ended amplifiers contained within the balanced amplifier of FIG. 6.

Focusing now on the present invention, FIG. 6 illustrates a balanced amplifier generally designated 60 constructed in accordance with the present invention. The balanced amplifier 60 includes some of the same elements as the balanced amplifier 10, which same elements are indicated by like-reference numerals: the input port 12, the conductor 14, the conductor 20, the input load 22, the output load 26, and the output port 24. The balanced amplifier 60 also includes an input Lange coupler 62 or other 3 dB 90° hybrid coupler and an output Lange coupler 64 or other 3 dB 90° hybrid coupler. As described in more detail below, the input Lange coupler 62 is substantially different that the output Lange coupler 64. However, in the preferred embodiments of the invention, the balanced amplifier 60 includes two substantially identical single-ended amplifiers 66a and 66b. Each of the single-ended amplifiers 66 includes an input matching network 68, an active gain device 70 and an output matching network 72 as illustrated in FIG. 7. As described in more detail below, the frequencies of one or both of the cross-over points of the Lange coupler 62 is different than the frequencies of both the cross-over points of the Lange coupler 64 so that the transfer function of the two Lange couplers has one or no peaks. Consequently, the single-ended amplifiers 66a and 66b may be relatively easily and effectively designed to equalize the single or no peak response of the Lange couplers and thereby provide a balanced amplifier having a flat gain over the operating band.

The following is one technique among others for designing the balanced amplifier 60 to provide substantially uniform gain over the desired band, for example, 2–6 GHz. First, a variety of Lange couplers are designed with center frequencies approximately equally spaced within the operating band. In the band of the aforesaid example, it may be useful to preliminarily design Lange couplers to operate at center frequencies for each ½ GHz within the range. However, for wide bands it may not be useful to design Lange couplers with center frequencies near the end points of the bands. As noted above, the center frequency of each Lange coupler is determined by the length of the finger elements within the Lange coupler. Also, as noted above, the width of each finger element and the gaps between the finger elements determine the differences in coupling at the various frequencies. The coupling is ordinarily designed such that the difference (delta) in coupling at the center frequency of the coupler is approximately the same as the difference in coupling at one or both end points of the operating band to avoid large differences. Consequently, these three parameters (as well as the composition of the fingers) determine the frequency of the cross-over points.

Figure 8:
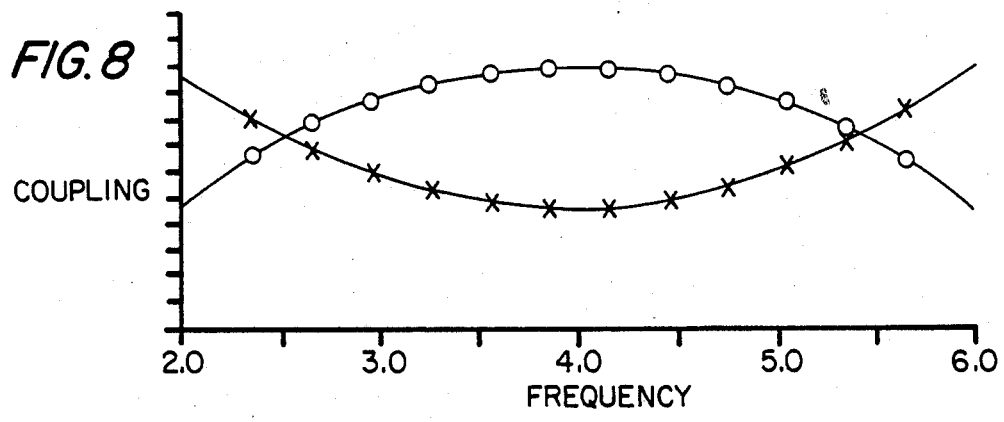
FIG. 8 is a graph illustrating the coupling of a preliminary input Lange coupler of the balanced amplifier of FIG. 6 as a function of frequency.
Figure 9:
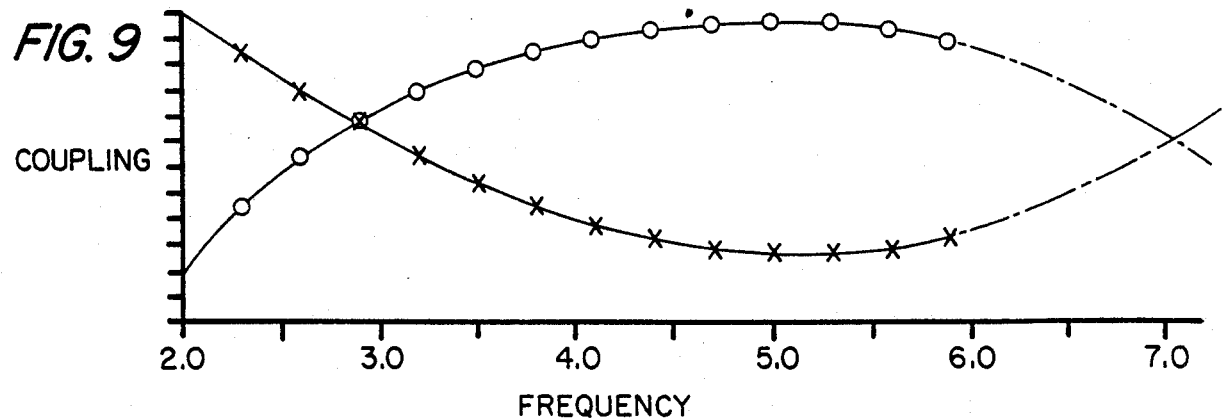
FIG. 9 is a graph illustrating the coupling of a preliminary and final output Lange coupler of the balanced amplifier of FIG. 6 as a function of frequency.

A Touchstone ™ computer program produced by EESOF, Inc. of West Lake Village, Calif. may be used to plot the frequency response of each of the Lange couplers. Next, two compatible Lange couplers are selected such that one or both of the cross-over points of one of the Lange couplers is offset in frequency from the corresponding cross-over point or points of the other Lange coupler. Usually, at least one of the cross-over points of the input Lange coupler or other coupler is offset in frequency from both the cross-over points of the output Lange coupler or other coupler by at least 5% (and preferably at least 10%) of the center frequency of the input Lange coupler per octave of the operating frequency band. This may be accomplished by selecting an input Lange coupler or other coupler having a center frequency which is offset from the center frequency of an output Lange coupler or other coupler by at least 5% (and preferably at least 10%) of the center frequency of the input Lange coupler. In some applications, it may also be desirable to select the Lange couplers based in part on their length; a Lange coupler of very low frequency such as 3 GHZ may be too large for the intended application and a Lange coupler having a center frequency over 10 GHz (for other operating bands) may be too small to easily fabricate. In the aforesaid example, Lange couplers with center frequencies of 4 and 5 GHz and delat values as illustrated in FIGS. 8 and 9, respectively, may originally be selected because the upper crossing point frequencies of the two Lange couplers differ by approximately 1.5 GHz (5.5 GHz and 7.0 GHz, respectively), and Lange couplers having center frequencies of 4 and 5 GHz are convenient sizes to manufacture and utilize. However, it should be clearly understood that the primary object of the invention is to provide a microwave amplifier having a flat response over a wide band so that other combinations of Lange couplers having lesser and greater center frequencies may be utilized to achieve this object.

Figure 10:
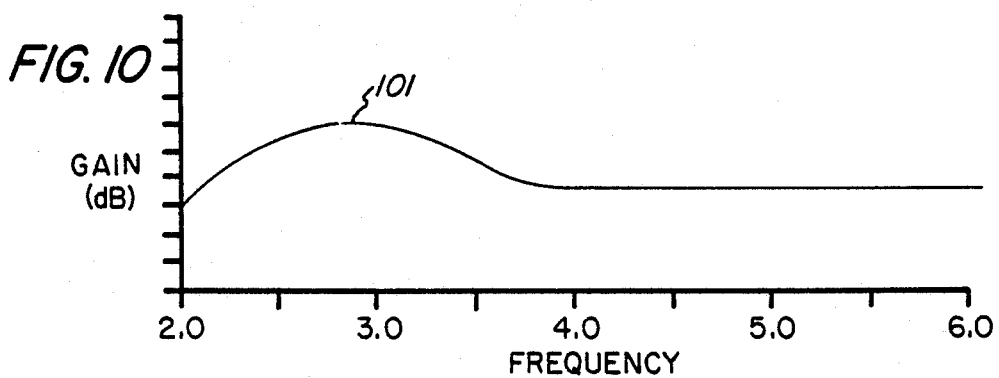
FIG. 10 is a graph illustrating the effect of the input and output Lange couplers of FIG. 6 on the gain of the balanced amplifier.

Next, the Touchstone computer program is used to plot the frequency response of the balanced amplifier having the selected pair of Lange couplers and a pair of identical, unity gain single-ended amplifiers in order to determine the effect of the pair of Lange couplers on the overall gain. As illustrated schematically in FIG. 10, the pair of Lange couplers causes a single peak 101 in overall gain centered at the lower cross-over frequency of both Lange couplers which, as noted above, is approximately the same (2.8 and 2.9 GHz). There is no peak at the upper end of the operating band because the upper cross-over frequencies of the two Lange couplers do not coincide.

Next, the single-ended amplifiers are designed such that the gain of the single-ended amplifiers equalizes the single peak caused by the Lange couplers. This requires input and output matching networks which have only one gain ripple and such single-ended amplifiers may be designed relatively easily with substantial effectiveness. Then, descriptions of the Lange couplers and the single-ended amplifiers are input to the Touchstone computer program to generate a gain plot as a function of frequency. Assuming the resultant gain is not yet ideal, an "Optimization" routine within the Touchstone computer program may be utilized to modify the designs of either of the input Lange coupler, the single-ended amplifiers, or the output Lange coupler. To utilize the Optimization routine, an operator enters into the program one or more performance goals which the operator desires the balanced amplifier to provide, such as a maximum limit to the deviation from flatness of the gain, a minimum gain restraint, or an input and output return loss. It may be prudent to add or change just one performance constraint during each usage of the Optimization routine to gradually home-in on the final design. After each such iteration, the Touchstone program may provide a graph of the coupling of each Lange coupler if it has been changed by the optimization routine and also a graph of the overall gain of the balanced amplifier and the design of the single-ended amplifiers if they have been changed.

Figure 11:
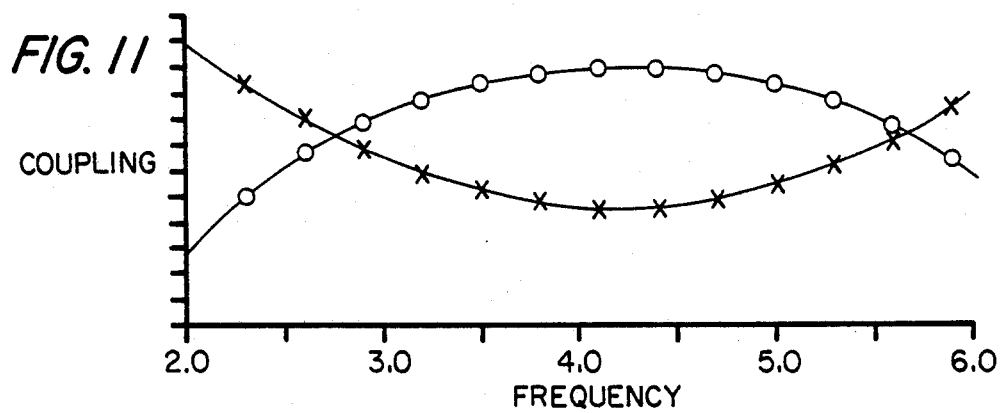
FIG. 11 is a graph illustrating the coupling of a final input Lange coupler of the balanced amplifier of FIG. 6 as a function of frequency.
Figure 12:
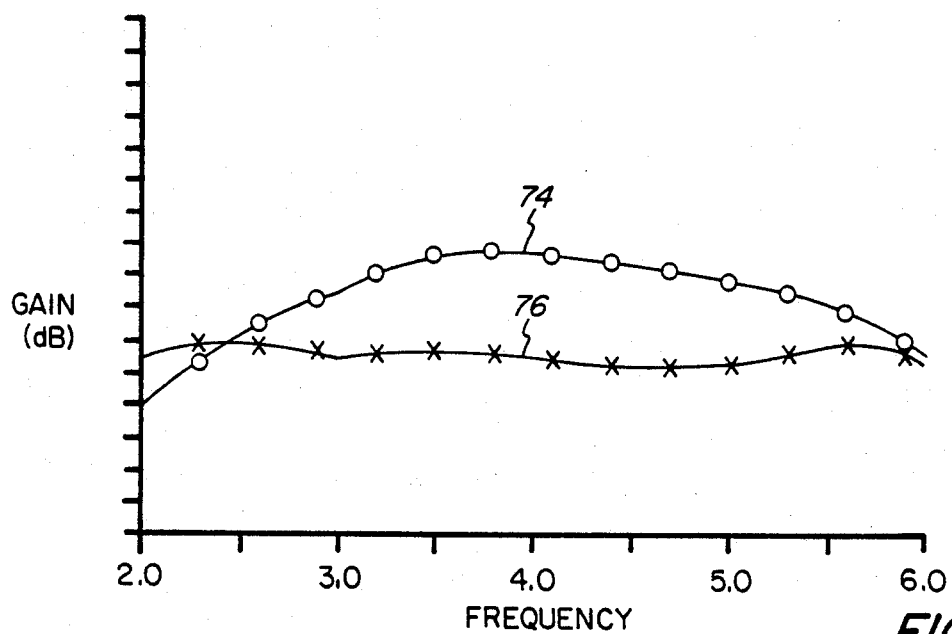
FIG. 12 is a graph of the gain of the single-ended amplifiers within the balanced amplifier of FIG. 6 as a function of frequency and is also a graph of the overall gain of the balanced amplifier as a function of frequency.

In the aforesaid example, the final design of the balanced amplifier as provided by the Optimization routine includes the Lange coupler 62 which has a center frequency of approximately 4.2 GHz and a frequency response illustrated in FIG. 11, the Lange coupler 64 which has a center frequency of approximately 5.0 GHz and a frequency response shown in FIG. 9, single-ended amplifiers 66a and 66b which have a frequency response illustrated by a graph 74 in FIG. 12 and an overall gain to the balanced amplifier illustrated by a graph 76 in FIG. 12. Notice that the overall gain is substantially flat.

Figure 13:
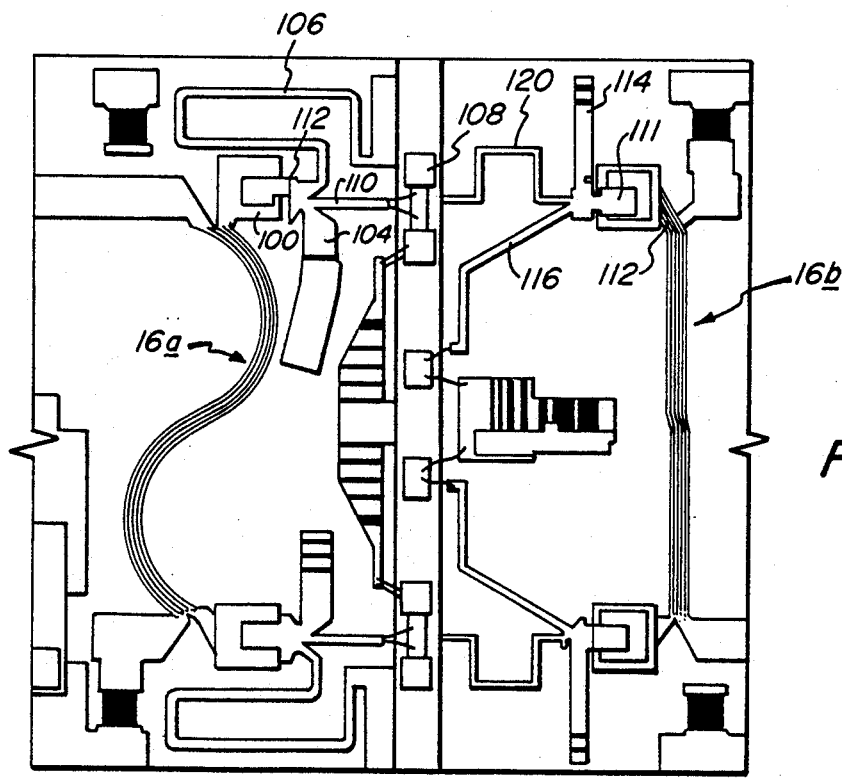
FIG. 13 is a plan view of the balanced amplifier of FIG. 6 in its final form.
Figure 14A:
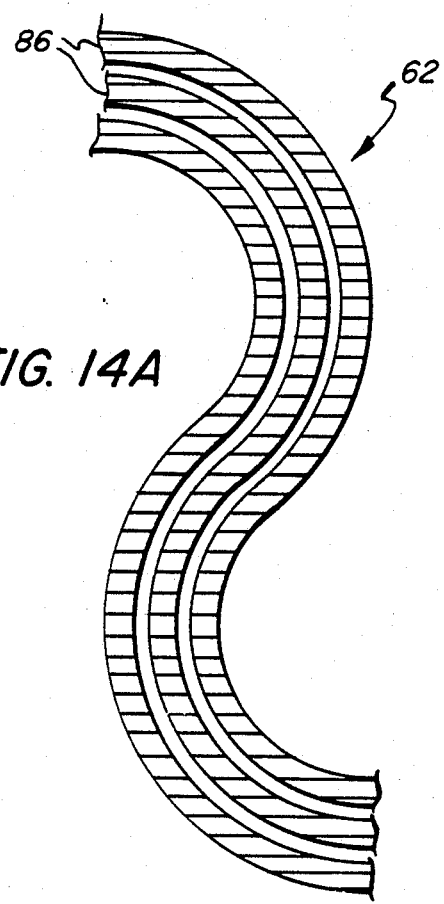
FIG. 14(a) is a schematic diagram of the input Lange coupler of the balanced amplifier of FIG. 6
Figure 14B:
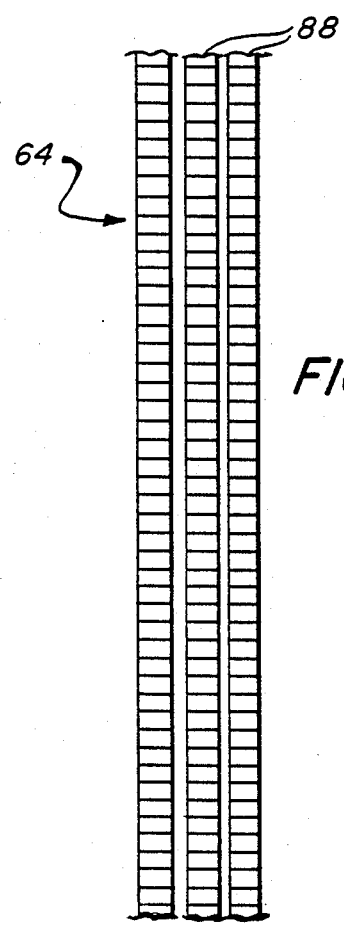
FIG. 14(b) is a schematic diagram of the output Lange coupler of the balanced amplifier of FIG. 6.

FIG. 13 is a plan view of the balanced amplifier 60 after manufacture and shows the input Lange coupler 62 and the output Lange coupler 64. As noted above, the input Lange coupler has a lesser center frequency than the output Lange coupler and, therefore, requires longer finger elements 86 than finger elements 88 of the output Lange coupler 64 as further illustrated in FIGS. 14(a) and 14(b). Because it was desirable in this particular application of the invention to limit the length of the Lange couplers, the finger elements of the Lange couplers 62 have been manufactured in an "S" shape although this is not necessary. In the aforesaid example, the finger-like elements 86 have a length of 315 mils, a width of 1.2 mils and a gap of 1.1 mils, and the finger-like elements 88 have a length of 240 mils, a width of 1.8 mils and a gap of 0.7 mils.

By way of example, the input matching network illustrated in FIG. 13 comprises a capacitor 102 which provides impedance matching, a microstrip transmission line 100 which leads to the capacitor 102, an open circuit transmission line 104 which provides impedance matching, a short circuit transmission line 106 which provides impedance matching and a D.C. return for the active device, FET 108, and a microstrip transmission line 110 which provides impedance matching, leads to the FET input and absorbs the parasitic inductance of the bond wires of the FET. The output matching network illustrated in FIG. 14 comprises a microstrip transmission line 120 which absorbs bond wire parasitics and provides impedance matching and an output path from the FET; a short circuit transmission line 116 which provides impedance matching and bias current injection, an open circuit transmission line 114 which provides impedance matching, a capacitor 111 which provides impedance matching and D.C. blocking, and a microstrip transmission line 112 which leads from the capacitor 111 to the Lange coupler 64 and provides impedance matching.

After the balanced amplifier 60 is manufactured according to the final design, the gain may be fine-tuned by standard techniques such as adding gold foil 80 to adjust the input matching network 68.

In another embodiment of the invention, the lower cross-over point of the input Lange coupler is offset from the lower cross-over point of the output Lange coupler and the upper cross-over point of the input Lange coupler is offset from the upper cross-over point of the output Lange coupler. This may be accomplished by designing the input Lange coupler to have a center frequency below the mid-frequency of the operating band and an output Lange coupler having a center frequency above the midpoint of the operating band or vice-versa, and selecting the width of the coupler fingers and the gaps between the fingers accordingly.

In still another embodiment of the invention, Lange couplers are selected such that the lower cross-over point of the input Lange coupler is offset from the lower cross-over point of the output Lange coupler and the upper cross-over points of both Lange couplers are approximately the same. A combined response of these two Lange couplers will yield a peak at the upper cross-over point which may be equalized by either the inherent drop-off of gain of the active gain device or by mismatch of the input and output matching networks.

Figure 15:
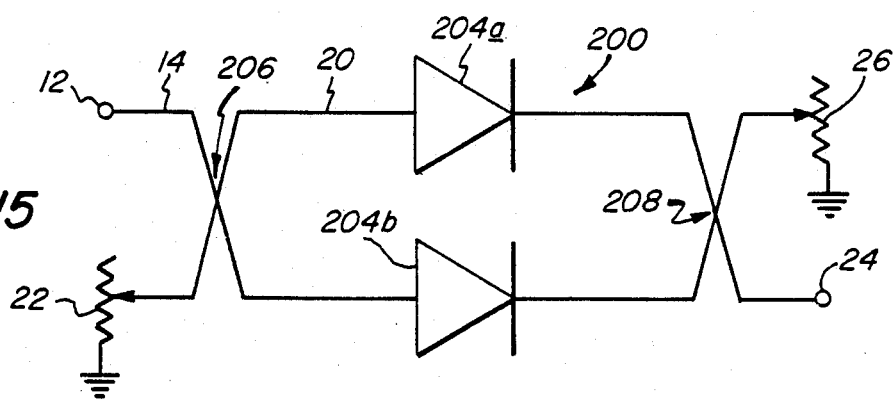
FIG. 15 is a schematic diagram of a balanced pin-diode attenuator according to the present invention.

FIG. 15 illustrates yet another embodiment of the invention in the form of a balanced pin-diode attenuator 200. The attenuator 200 includes some of the same elements as the balanced amplifier 10, which same elements are indicated by like reference numerals: the input port 12, the conductor 14, the conductor 20, the input load 22, the output load 26, and the output port 24. The balanced pin-diode attenuator 200 also includes two, substantially identical pin diodes 204a and 204b, an input Lange coupler 206 or other 3 dB 90° hybrid coupler and an output Lange coupler 208 or other 3 dB 90° hybrid coupler. The pin diodes 204, 204 are biased by a current to determine the amount of attenuation provided by them. In the illustrated embodiment, the PIN diodes are connected serially. However, if desired, the PIN diodes may be connected as shunts, such that the cathode of the diode 204a is connected to the conductor 20 and the anode is connected to ground, and the cathode of the diode 204b is connected to the conductor 14 and the anode is connected to ground. The frequencies of one or both of the cross-over points of the Lange coupler 206 is different than the frequencies of both the cross-over points of the Lange coupler 208, so that the transfer function of the two Lange couplers together, has no more than one peak. Usually, at least one of the cross-over points of the input Lange coupler or other coupler is offset in frequency from both the cross-over points of the output Lange coupler or other coupler by at least 5% (and preferably at least 10%) of the center frequency of the input Lange coupler per octave of the operating frequency band. This may be accomplished by selecting an input Lange coupler or other coupler having a center frequency which is offset from the center frequency of the output Lange coupler or other coupler by at least 5% (and preferably at least 10%) of the center frequency of the input Lange coupler.

Figure 16:
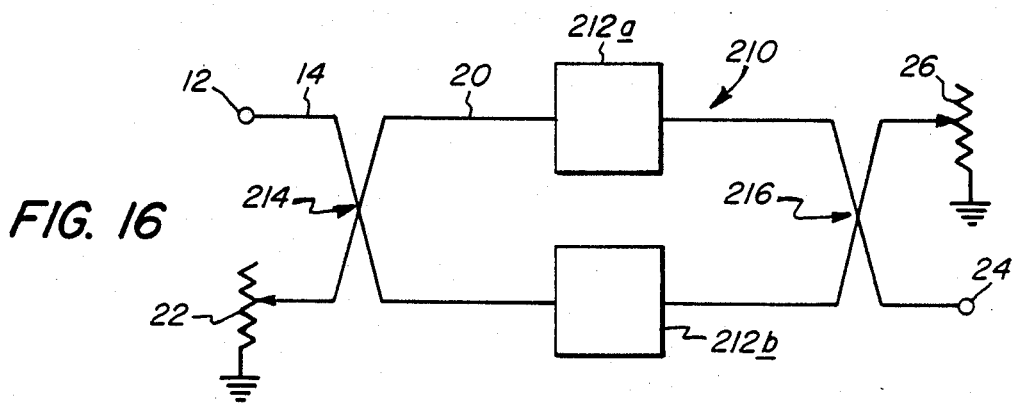
FIG. 16 is a schematic diagram of a balanced gain equalizer according to the present invention.

FIG. 16 illustrates another embodiment of the invention in the form of a balanced gain equalizer 210. The equalizer 210 includes some of the same elements as the balanced amplifier 10 which same elements are indicated by like-referenced numerals.

The balanced gain equalizer 210 also includes two RLC passive circuits 212a and 212b which are identical to each other, an input Lange coupler 214 or other 3 dB 90° hybrid coupler and an output Lange coupler 216 or other 3 dB 90° hybrid coupler. In one embodiment of the invention, the passive circuits 212, 212 equalizes the gain or loss of the circuitry and/or transmission lines which input to the balanced gain equalizer. The frequencies of one or both of the cross-over points of the Lange coupler 214 is different than the frequencies of both the cross-over points of the Lange coupler 216, so that the combination of the two Lange couplers have one or no peaks in transfer function. In the embodiment described above, the passive circuits 212a and 212b also equalize the single peak, if any, caused by the Lange couplers 214 and 216. Usually, at least one of the cross-over points of the input Lange coupler or other coupler is offset in frequency from both the cross-over points of the output Lange coupler or other coupler by at least 5% (and preferably at least 10%) of the center frequency of the input Lange coupler per octave of the operating frequency band. This may be accomplished by selecting an input Lange coupler or other coupler having a center frequency which is offset from the center frequency of the output Lange coupler or other coupler by at least 5% (and preferably at least 10%) of the center frequency of the input Lange coupler.

In another embodiment of the balanced gain equalizer, the Lange couplers are used to explain the gain or loss of the circuitry and transmission lines which input to the balanced gain equalizer 210. For example, if the transfer function of the circuity and transmission lines which lead to the balanced gain equalizer 210 has an amplitude valley at low frequencies and a flat response over the rest of the operating band, then the Lange couplers are designed such that both have a cross-over point at the frequency of teh valley, and have other cross-over points which are offset from each other, so that the peak in gain caused by the coincidence of the cross-over points in the Lange coupler equalizes the amplitude valley of the input circuitry and transmission line. Because the other cross-over point of the input Lange coupler is offset in frequency from the other cross-over point of the output Lange coupler, then there are no other peaks in the gain of the Lange couplers.

On the other hand, if the input circuitry and transmission lines exhibit a decrease in slope at the upper end of the frequency band, then the lower cross-over points of the two Lange couplers may be offset and the upper cross-over points of the two Lange couplers coincident to equalize the transfer function of the input circuitry and transmission lines.

By the foregoing, broad band, balanced microwave components such as amplifiers have been disclosed. However, numerous modifications and substitutions may be made without deviating from the scope of the invention. Therefore, the invention has been disclosed by way of illustration and not limitation, and reference should be made to the following claims to determine the scope of the invention.

We claim

1. A broad band microwave amplifier comprising:
    an input Lange coupler receiving an input signal, the graph of coupling as a function of frequency of said input Lange coupler exhibiting lower and upper frequency cross-over points;
    a first single-ended amplifier connected to receive a portion of said input signal traveling through said input Lange coupler;
    a second single-ended amplifier connected to receive a portion of said input signal coupled through said input Lange coupler; and
    an output Lange coupler connected to receive the input signal portions after amplifications by said single-ended amplifiers, the graph of coupling as a function of frequency of said output Lange coupler exhibiting lower and upper frequency cross-over points, and wherein
    at least one of said cross-over points of said input Lange coupler is substantially offset in frequency from both of the cross-over points of said output Lange coupler.

2. An amplifier as set forth in claim 1 wherein the offset cross-over point of said input Lange coupler is offset from both cross-over points of said output Lange coupler by at least 5% of the center frequency of said input Lange coupler per octave of operating frequency band.

3. An amplifier as set forth in claim 1 wherein the input Lange coupler comprises a plurality of finger-like elements of one length and the output Lange coupler comprises a plurality of finger-like elements of another substantially different length.

4. An amplifier as set forth in claim 1 wherein the input Lange coupler comprises a plurality of parallel finger-like elements and the output Lange coupler comprises a plurality of parallel, finger-like elements and the gaps between the finger-like elements of the input Lange coupler and the widths of the finger-like elements of the input Lange coupler are substantially different than the gaps between the finger-like elements of the output Lange coupler and the widths of the finger-like elements of the output Lange coupler, respectively.

5. An amplifier as set forth in claim 1 wherein:
    one of said Lange couplers has a center frequency of approximately 4.2 GHz and operates over a frequency band of 2-6 GHz, and the other Lange coupler has a center frequency of approximately 5 GHz and operates over said frequency band.

6. An amplifier as set forth in claim 1 wherein each of said single-ended amplifiers is designed to equalize the gain variation caused by said input and output Lange couplers.

7. An amplifier as set forth in claim 1 wherein the center frequency of said input Lange coupler is substantially different than the center frequency of said output Lange coupler.

8. An amplifier as set forth in claim 7 wherein the center frequency of said input Lange coupler differs from the center frequency of said output Lange coupler by at least 5% of the center frequency of said input Lange coupler per octave of operating frequency band.

9. An amplifier as set forth in claim 8 wherein the center frequency of said input Lange coupler differs from the center frequency of said output Lange coupler by at least 10% of the center frequency of said input Lange coupler per octave of operating frequency band.

10. A method for producing a broad band, microwave amplifier, said method comprising the steps of:
    designing an input Lange coupler to have a center frequency within an operating band of a microwave amplifier, the graph of coupling as a function of frequency of said input Lange coupler exhibiting lower and upper frequency cross-over points,
    designing an output Lange coupler to have a center frequency within said operating band but substantially different than said center frequency of said input Lange coupler, and such that the graph of coupling as a function of frequency of said output Lange coupler exhibits lower and upper frequency cross-over points of which at least one of said cross-over points of said output Lange coupler occurs at a substantially different frequency than both the cross-over points of said input Lange coupler,
    determining a rippling effect of said input and output Lange couplers on the gain of said microwave amplifier, and
    designing a pair of single-ended amplifiers including input and output matching networks to equalize said rippling effect of said Lange couplers such that the overall gain of said microwave amplifier is substantially flat within said operating band.

11. A method as set forth in claim 10 wherein the effect of said input and output Lange couplers on the gain of the balanced amplifier is determined by programming a computer with data defining said input and output Lange couplers and a pair of unity gain single-ended amplifiers associated therewith.

12. A method as set forth in claim 11 further comprising the step of optimizing the design of said input and output Lange couplers by programming said computer with performance goals for said microwave amplifier.

13. A broadband, balanced microwave amplifier comprising:
an input coupler receiving an input signal, the graph of coupling as a function of frequency of said input coupler exhibiting lower and upper frequency cross-over points;
a first single-ended amplifier connected to receive a portion of said input signal traveling through said input coupler;
a second single-ended amplifier connected to receive a portion of said input signal coupled through said input coupler; and
an output coupler connected to receive the input signal portions after amplification by said single-ended amplifiers, the graph of coupling as a function of frequency of said output coupler exhibiting lower and upper frequency cross-over points, and wherein
at least one of said cross-over points of said input coupler is substantially offset in frequency from both of the cross-over points of said output coupler.

14. An amplifier as set forth in claim 13 wherein the offset cross-over point of said input coupler is offset from both cross-over points of said output coupler by at least 5% of the center frequency of said input coupler per octave of operating frequency band.

15. An amplifier as set forth in claim 13 wherein the input coupler comprises a plurality of finger-like elements of one length and the output coupler comprises a plurality of finger-like elements of another substantially different length.

16. An amplifier as set forth in claim 13 wherein the input coupler comprises a plurality of parallel finger-like elements and the output coupler comprises a plurality of parallel, finger-like elements and the gaps between the finger-like elements of the input coupler and the widths of the finger-like elements of the input coupler are substantially different than the gaps between the finger-like elements of the output coupler and the widths of the finger-like elements of the output coupler, respectively.

17. An amplifier as set forth in claim 13 wherein the center frequency of said input coupler is substantially different than the center frequency of said output coupler.

18. An amplifier as set forth in claim 17 wherein the center frequency of said input coupler differs from the center frequency of said output coupler by at least 5% of the center frequency of said input coupler per octave of operating frequency band.

19. An amplifier as set forth in claim 18 wherein the center frequency of said input coupler differs from the center frequency of said output coupler by at least 10% of the center frequency of said input coupler per octave of operating frequency band.

20. A balanced microwave component comprising:
an input 3 dB, 90° hybrid coupler receiving an input signal, the graph of coupling as a function of frequency of said input 3 dB, 90° coupler exhibiting lower and upper frequency cross-over points;
a first gain element connected to receive a portion of said input signal traveling through said input 3 dB, 90° hybrid coupler;
a second gain element connected to receive a portion of said input signal coupled through said input 3 dB, 90° hybrid coupler; and
an output 3 dB, 90° hybrid coupler connected to receive the input signal portions after passing through said gain elements, the graph of coupling as a function of frequency of said output 3 dB, 90° coupler exhibiting lower and upper frequency cross-over points, and wherein
at least one of said cross-over points of said input 3 dB, 90° hybrid coupler is substantially offset in frequency from both the cross-over points of said output 3 dB, 90° hybrid coupler.

21. A balanced microwave component as set forth in claim 13 wherein the offset cross-over point of said input coupler is offset from both cross-over points of said output coupler by at least 5% of the center frequency of said input coupler per octave of operating frequency band.

22. A balanced microwave component as set forth in claim 20 wherein said first and second gain elements each comprises a pin diode.

23. A balanced microwave component as set forth in claim 20 wherein said first and second gain elements each comprises only passive, gain equalizing circuitry.

24. A balanced microwave component as set forth in claim 20 wherein said input 3 dB, 90° hybrid coupler is a Lange coupler and said output 3 dB, 90° hybrid coupler is a Lange coupler.

* * * * *